Sept. 3, 1957 R. H. WATERS 2,805,333
TRAVELING WAVE TUBE MIXER
Filed July 26, 1955
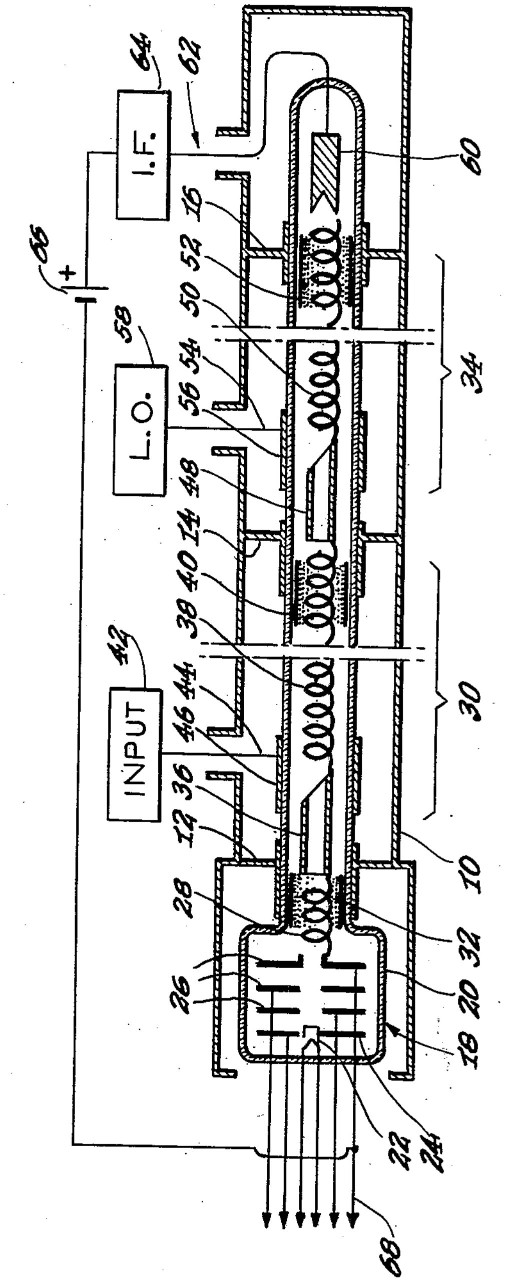
INVENTOR.
RICHARD H. WATERS
BY
Morton Amster
ATTORNEY.

United States Patent Office 2,805,333
Patented Sept. 3, 1957

2,805,333

TRAVELING WAVE TUBE MIXER

Richard H. Waters, Sunnyvale, Santa Clara, Calif., assignor to Sylvania Electric Products Inc., a corporation of Massachusetts Application July 26, 1955, Serial No. 524,361
2 Claims. (Cl. 250—20)

The present invention relates to traveling wave tubes of special form to function as mixers.

Traveling wave tubes have been widely known for many of their desirable operating characteristics, prominently including high gain over a broad frequency band, even with low-level input signals. It is frequently desired that radio signals be heterodyned with local oscillation, to be amplified at an intermediate frequency and ultimately detected. While traveling wave tubes have excellent characteristics with respect to band-width and high gain, when used as amplifiers, they have not been regarded as efficient detectors. Where detection has been attempted with traveling wave tubes, the operation has depended upon a velocity-sorting process requiring supplemental electrodes, where only part of the beam was allowed to reach the intermediate frequency output electrode.

An object of the present invention is to provide a novel traveling wave tube mixer operating according to a very different principle, and with additional desirable operating characteristics. More specifically, an object of this invention is to achieve mixing with a high degree of isolation between the local oscillation source and the input signal.

A further object is to employ a traveling wave tube as a mixer in a more efficient fashion than heretofore known in a system having a high degree of isolation between the local oscillator and the input signal source. In another aspect, the invention is concerned with provision of a novel traveling wave tube mixer wherein radiation of the local oscillation by way of the input signal channel is minimized.

A still further object of this invention is to minimize the power requirements of a local oscillator, by providing efficient coupling to the mixer and efficient mixing.

Still further, an object of this invention is to utilize not merely the velocity variations in the electron beam, but actually to produce and utilize intermediate frequency variations in the direct-current beam of a traveling wave tube. At the least its output end is made to operate in saturated condition. As will be seen, saturation is produced in the illustrative traveling wave by means of a local oscillator of relatively low power, and the arrangement is such that the local oscillation is isolated from the input signal channel.

In the illustrative embodiment which is described in detail below, it will be seen that a multiple-section traveling wave tube is provided including a first section where the input signal is coupled and, advantageously amplified to a high level. In this section of the tube, the operation is in the so-called small-signal region. In another section of the traveling wave tube, the signal in the modulated beam is heterodyned with a local oscillation. A local oscillator signal is impressed at the input end of a following section of the traveling wave tube, providing for complete suppression of high-frequency transmission from the local oscillator frequency coupling device back toward the input signal section of the tube. The local oscillator signal is coupled to the circuit portion and the beam of the second section of the tube. The non-linearity required for mixing is achieved by providing an appropriately high level of local oscillator signal, so that the second section, or at least a portion of it, operates in the saturation region. Unlike the input amplifier section of the tube which is preferably operated in the low-level signal region, detection is accomplished under the limiting conditions of large-signal operation in the novel traveling wave tube. The theory of large-signal operation of traveling wave amplifiers, and the limiting conditions are generally known. For example, a discussion appears in the March 1955 issue of the "Proceedings of the I. R. E." at pages 260 through 277 inclusive, "A Large-Signal Theory of Traveling-Wave Amplifiers" by P. K. Tien and L. R. Walker.

The present traveling wave tube mixer has numerous advantages over conventional types of mixers. For example, the traveling wave tube mixer can readily be designed for extremely broad-band opertaion. This mixer is not susceptible to "burn-out," an ever-present danger in the use of crystal mixers. The intermediate frequency is available by way of an electron beam. Since very nearly perfect attenuators can be used for suppressing the fields identified with the circuit portion of the traveling wave tube, the intermediate frequency can be derived with little concern for feed-back of the high-frequency output to the input end of the system. Moreover, the local oscillator signal can be effectively isolated from the input section of the tube by an attenuator between the sections with the resulting advantages that the input section can be efficiently utilized to amplify the input signal alone, and the local oscillation is not coupled out of the system by way of the antenna and input channel, and there is a minimum of disturbance and instability of the oscillator, such as might result from close coupling of the local oscillator to the input signal amplifier and the intermediate frequency channel in other forms of mixers.

The nature of the invention, and further features of novelty as well as further advantages will be better appreciated from the following detailed description of an illustrative embodiment in which reference is made to the accompanying drawing forming a part of the disclosure.

The single figure of the drawings is a combined wiring diagram and schematic illustration of a traveling wave tube mixer embodying the features of the present invention.

In the drawing a metallic shield 10 is shown including a series of walls 12, 14 and 16, dividing the shield into four sections. The left hand section of this shielded structure encloses an electron gun generally designated by the numeral 18, enclosed in an enlarged end portion of the insulating evacuated tube envelope 20 of suitable glass or the like. The gun 18 includes a cathode 22, a beam-forming electrode 24 that is customarily charged negatively with respect to the cathode 22, and a series of accelerating and focusing anodes 26. The last anode 26, energized by higher direct-current potential than any of the other anodes, is connected by way of a choke 28 to the first section 30 of a two-section traveling wave tube. Advantageously, a coating of energy absorbing material 32 is associated with, and forms a part of choke 28. This choke suppresses reverse transmission of input signal energy.

The illustrative tube includes two sections, a first section 30 previously mentioned, and a second section 34. It should be understood that while two sections are disclosed, it is entirely within the present contemplation to employ additional sections as may be convenient or desirable. Thus, section 30 might be formed of two amplifier sections, one after the other, with conventional attenuators therebetween.

Section 30 includes a probe 36 in the form of a hollow cylinder having a slant end as shown. Additionally, a helix 38 is provided, and, at the output end of helix 38 there is an attenuator 40 in the form of a suitable energy absorbing coating. The first few turns of helix 38 are specially spaced from each other, with varying pitch, so as to coact with tube 36 in coupling energy to the direct current beam and to the helix 38. The remainder of helix 38 is formed for optimum signal amplification according to the well known principles of traveling wave tubes. Helix 38 is illustrative of a variety of so-called "slow-wave circuit elements" useful in traveling wave tubes.

Signal is coupled to probe 36 and helix 38 from an input signal source 42, usually an antenna and a suitable wave guide or coaxial line, this input signal reaching the traveling wave tube by a probe 44 and a short cylinder 46 in the region of probe 36 within shield 10.

The direct current beam, formed in gun 18, is maintained as a focused beam by an axial field magnet (not shown) and by energization of helix 38 and cylindrical probe 36 at a uniform potential.

Probe 36 and helix 38 are connected to choke 28 and the final anode 26 of gun 18, so that these elements are all operated at the same potential.

The operation of the traveling wave tube described at this point is entirely conventional. The direct current beam which is produced in gun 18 has signal of low level coupled thereto by probe 36 and the first portion of helix 38; and the signal is coupled between the beam and the helix in a way to produce ever increasing amplification along the beam and the helix toward attenuator 40. At this point the electron beam is prominently modulated with the amplified signal, but the electromagnetic field associated with helix 38 is effectively absorbed by attenuator 40.

Second section 34 of the traveling wave tube is very similar to the first section 30 just described, insofar as structure is concerned. It includes a hollow cylindrical probe 48, a helix 50, and an attenuator 52, probe 48 being at the input end of helix 50 nearer to gun 18 and attenuator 52 being at the end of helix 50 remote from gun 18. An input coupling probe 54 is connected to a short cylinder 56 within shield 10 to impress signal input on probe 48 and the input end of helix 50. Probe 54 is connected to local oscillator 58 by a coaxial line or other suitable means.

At the end of helix 50, where the amplified signal would normally be obtained in a conventional traveling-wave-tube amplifier, attenuator 52 is here provided to absorb the energy associated with the circuit portion 50 of the second section 34 of the traveling wave tube shown. Collector 60 is disposed in the path of the electron beam from gun 18, directly opposite the end of helix 50 remote from the electron gun. Collector 60 is connected through its external terminal, via coaxial line 62 to I. F. output circuit 64 of conventional design. A direct current positive potential supply 66 for collector 60 is provided in a D. C. path through unit 64 between collector 60 and gun 18. I. F. unit 64 includes the conventional amplifier for the intermediate frequency signal, and it also includes a suitable rectifier for detection, as is customary in such utilization circuits. The connection between collector 60 and bias supply 66 which extends through unit 64 may be a band-pass D. C.-conductive circuit with appropriate coupling to an I. F. amplifier. The potential applied by supply 66 to collector 60 develops a D. C. potential gradient between the collector 60 and the end of helix 50 remote from gun 18. It should be noted that helix 50 is energized at the same potential as the final anode 26 of gun 18, since elements 26, 28, 36, 38, 48 and 50 are all interconnected inside tube envelope 20, and they extend to the external gun connection to which supply 66 is joined, as shown. This field gradient, established directly between collector 60 and the helix 50, is instrumental in suppressing possible disturbing effects that could result from secondary emission from collector 60 in the absence of such field. For this reason, it is also desirable to treat the surface of the collector and to make it of an appropriate material that will minimize secondary emission.

Section 34 of the traveling wave tube shown, operates differently in several respects from the input section 30 previously described. For one thing, the beam that penetrates probe 48 has the amplified modulation energy that was imparted in section 30, whereas a pure D. C. beam enters probe 36 of the first section 30. Additionally, the signal imparted by local oscillator 58 is ordinarily of a higher level than that applied at input channel 42. The signal from local oscillator 58, coupled by probe 54 and cylinder 56 to cylindrical probe 48 and the input end of the helix 50 of the traveling wave section 34 is coupled to the beam and to the remainder of the helix itself. At the input end of helix 50, each of the signals may be further amplified, that is, the input signal on the beam and the local oscillation coupled into the input end of helix 50. The level of signals is purposely arranged to drive the tube to saturation, at least at the output portion of section 34. The interaction of the field associated with the helix in the saturation region and the D. C. beam with its modulation, results in non-linear operation of the beam, and bunching at intermediate-frequency is produced. Amplification of the local oscillation and the input signal, or of the I. F. signal if any, is not essential. The non-linear operation provides an efficient mixing process which makes available in an efficient manner, a large I. F. signal at collector 60.

This operation is to be contrasted with a suggested mode of operation of traveling wave tubes used as mixers, where velocity sorting is depended upon for yielding the beat-frequency signal. Velocity sorting is necessary to produce the non-linear operating characteristic necessary for mixing. Such non-linear operation does not occur in small-signal traveling wave tubes, unless additional specially placed electrodes are provided for this purpose. Such velocity sorting could be accomplished, for example, by passing the electron beam containing both the input signal and the local oscillation, through an electrode with a small aperture for the beam, and thence to a collector, with the apertured electrode operating at lower potential than the collector and thus allowing only the higher-velocity electrons to reach the collector. Such a process requires a more complex electrode system in the traveling wave tube; and the I. F. signal yield in relation to low level input signals, is distinctly inferior to that of the present traveling wave tube system.

In a practical embodiment, the traveling wave tube illustrated was utilized in a band extending from 2000 to 4000 megacycles per second, or 2000 megacycles wide. The local oscillator was operated at a frequency separated from a particular input signal in the band of operation, so as to yield a beat frequency in the output circuit 64 of 30 megacycles. Naturally, the frequencies mentioned are illustrative. The tube shown can readily be designed for higher frequencies, and for broader bands at such higher frequencies, than the values mentioned above.

As a mixer it has already been noted that the disclosed device compares favorably with previously suggested traveling wave tube mixers. The tube can be efficiently designed as an amplifier with an appropriate input section 30 or multiple input sections 30; and the saturation-type output section 34 can separately be designed to achieve detection in an efficient manner utilizing the saturation principle. With this combination of separate signal-input and saturation-detection portions, there can be unusually effective isolation between the local oscillator 58 and the input channel 42. Such isolation is quite important, because it is desirable to confine the input section or sections to amplification of the input signal, and because it is desirable to avoid radiation of the local oscillator signal to an antenna or the like, and further because it is desirable to avoid impressing any disturbing signal on the local oscillator.

With the arrangement shown, it is feasible to utilize a local oscillator of minimal power requirement, an important consideration where very high frequencies may be involved. Thus, it is unnecessary to depend on a local oscillator of comparatively high power level, coupling such oscillator to the traveling wave tube by way of a heavy isolating impedance. In the system shown, the amplified input signal has virtually no disturbing effect upon the local oscillator, with the result that a low power oscillator can be used with direct coupling to the mixer section 34 of the traveling wave tube structure. Attenuator 52 effectively absorbs the amplified local oscillator signal and the amplified input signal which are ordinarily no longer required once the detection function is accomplished. It should be noted that I. F. signal is associated with the second-section helix, and with a saturated output section such signal could in broad concept be obtained here with a suitable output coupler. However, the system shown has many advantages, in respect to simplicity of the output circuit, and suppression of unnecessary input signals at the output end of the tube.

The efficient traveling wave tube mixer disclosed compares favorably with basically different types of mixers presently known. In contrast to the usual crystal mixer, the traveling wave tube mixer not only amplifies weak input signals, but additionally, the traveling wave tube is free from burn-out danger such as might occur when heavy-energy pulses are impressed in a circuit containing a sensitive crystal mixer. Also, the traveling wave tube is of much broader band characteristics than usual crystal mixers. Further, there is inherent two-way isolation between the input signal source and the local oscillator, so that a stable oscillator and a pure input signal channel are realized without elaborate wave guide networks, and reverse transmission of this input signal to the input signal source is precluded. The particular embodiment of this invention is readily susceptible to varied modification and to further refinement, as will occur to those skilled in the art. Thus, while helices 38 and 50 are illustrated, other types of slow-wave circuit elements may be used in their place. Other changes will be self-evident. It is therefore appropriate that the invention should be broadly construed in accordance with its full spirit and scope.

What is claimed is:

1. A traveling wave mixer including a traveling wave tube having an electron gun for directing an electron beam along a path, a first slow wave circuit element extending along said path and having a signal input coupling device at the end thereof nearer said gun and an energy absorber at the end thereof remote from said gun, a second slow wave circuit element disposed along said path beyond said energy absorber and having a local oscillator input coupling device at the end thereof nearer said gun, and a collector in the path of said beam and exposed to the remote end of said second slow wave circuit, said slow-wave circuit elements having direct-current connections therebetween and having a single external direct-current terminal therefor, and energizing power and signal supplies related to cause saturation in the region of said second slow-wave circuit.

2. Apparatus for mixing a high frequency input signal with a local oscillator signal of different frequency to produce an intermediate frequency signal, comprising a traveling wave electron beam tube including a helical conductor for guiding oscillations, said helical conductor including first and second spaced and connected sections, an electron gun adjacent one end of said helical conductor arranged to direct an electron beam successively through the first and second sections thereof, a collector electrode spaced from the other end of said conductor and arranged to collect the emerging beam in its entirety, means for coupling an input signal to the end of said first section nearer said gun, said first section being operative when energized to amplify said input signal and to bunch said electron beam at the frequency of said input signal, a first attenuator disposed near the end of said first section remote from said gun and arranged to absorb the amplified input signal, means for coupling to the end of said second section nearer said gun a local oscillator signal having an amplitude to cause saturation in said second section thereby to produce bunching of the electron beam at an intermediate frequency, said first attenuator being further arranged to prevent transmission of said local oscillator signal toward said first section, a second attenuator disposed near the end of said second section remote from said gun and arranged to absorb the amplified local oscillator signal, and an output circuit to derive the intermediate frequency signal from said collector and including an external direct current terminal to permit application of a positive potential to said collector relative to said helical conductor thereby to establish an electrostatic field gradient in the space between the end of said second section and said collector.

References Cited in the file of this patent

UNITED STATES PATENTS

| | | |
|---|---|---|
| 2,541,843 | Tiley | Feb. 13, 1951 |
| 2,575,383 | Field | Nov. 20, 1951 |
| 2,578,434 | Lindenblad | Dec. 11, 1951 |
| 2,657,305 | Knol et al. | Oct. 27, 1953 |

OTHER REFERENCES

Traveling Wave Tubes by J. R. Pierce, 1950.

"Theory of the Large Signal Behavior of Traveling Wave Amplifiers" by Nordsieck, Proceedings, Inst. of Rad. Eng. May 1953.